United States Patent
Lee et al.

(10) Patent No.: US 8,951,881 B2
(45) Date of Patent: Feb. 10, 2015

(54) METHODS OF FABRICATING NONVOLATILE MEMORY DEVICES INCLUDING VOIDS BETWEEN ACTIVE REGIONS AND RELATED DEVICES

(71) Applicant: Samsung Electronics Co., Ltd., Suwon-si, Gyeonggi-do (KR)

(72) Inventors: Dong-Sik Lee, Yongin-si (KR); Jang-Hyun You, Seoul (KR); Jee-Hoon Han, Hwaseseong-si (KR); Young-Woo Park, Seoul (KR); Sung-Hoi Hur, Seoul (KR); Sang-Ick Joo, Changwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/279,786

(22) Filed: May 16, 2014

(65) Prior Publication Data

US 2014/0248755 A1 Sep. 4, 2014

Related U.S. Application Data

(62) Division of application No. 13/300,787, filed on Nov. 21, 2011, now Pat. No. 8,753,955.

(30) Foreign Application Priority Data

Feb. 9, 2011 (KR) .................. 10-2011-0011497

(51) Int. Cl.
*H01L 21/76* (2006.01)
*H01L 21/762* (2006.01)
*H01L 21/764* (2006.01)

(52) U.S. Cl.
CPC .... *H01L 21/76224* (2013.01); *H01L 21/76229* (2013.01); *H01L 21/764* (2013.01)
USPC .................... 438/421; 438/424; 257/E21.573

(58) Field of Classification Search
USPC ........................ 438/421, 424; 257/E21.573
See application file for complete search history.

(56) References Cited

U.S. PATENT DOCUMENTS

| 8,450,789 B2 | 5/2013 | Bicksler et al. |
| 2010/0295113 A1 | 11/2010 | Kang et al. |
| 2011/0303967 A1 | 12/2011 | Harari et al. |

FOREIGN PATENT DOCUMENTS

| JP | 2009-212218 | 9/2009 |
| KR | 1020060120977 A | 11/2006 |
| KR | 1020080003184 A | 1/2008 |
| KR | 1020080022380 A | 3/2008 |

*Primary Examiner* — Thanh V Pham
(74) *Attorney, Agent, or Firm* — Myers Bigel Sibley & Sajovec

(57) ABSTRACT

A method of fabricating a nonvolatile memory device includes forming trenches in a substrate defining device isolation regions therein and active regions therebetween. The trenches and the active regions therebetween extend into first and second device regions of the substrate. A sacrificial layer is formed in the trenches between the active regions in the first device region, and an insulating layer is formed to substantially fill the trenches between the active regions in the second device region. At least a portion of the sacrificial layer in the trenches in the first device region is selectively removed to define gap regions extending along the trenches between the active regions in the first device region, while substantially maintaining the insulating layer in the trenches between the active regions in the second device region. Related methods and devices are also discussed.

9 Claims, 12 Drawing Sheets

METHODS OF FABRICATING NONVOLATILE MEMORY DEVICES INCLUDING VOIDS BETWEEN ACTIVE REGIONS AND RELATED DEVICES

CROSS-REFERENCE TO RELATED APPLICATION

This application is a divisional of United States Patent Application No. 13/300,787, filed on Nov. 21, 2011, now US. Pat. No. 8,753,955, which claims priority and all the benefits accruing therefrom under 35 U.S.C. 119 from Korean Patent Application No. 10-2011-0011497 filed on Feb. 9, 2011, in the Korean Intellectual Property Office, the disclosures of which are hereby incorporated by reference herein in their entireties.

BACKGROUND

The present inventive concept relates to nonvolatile memory devices and methods of fabricating the same.

A nonvolatile memory integrated circuit device can retain data stored therein even in the event of power interruption. Therefore, nonvolatile memory integrated circuit devices can be widely used in information communication devices such as digital cameras, cellular phones, personal digital assistants (PDA), or MP3 players.

As information communication devices have become multi-functional and highly efficient, the demand for nonvolatile memory integrated circuit devices of large capacity and high integration has increased. Thus, efforts to shrink or reduce the sizes of memory cells in a nonvolatile memory integrated circuit device are progressing. However, the shrinking of the memory cell size may increase coupling of memory cells along a direction in which the bit lines extend. Accordingly, dispersion of cells may increase, making it more difficult to read memory cells.

SUMMARY

The present inventive concept provides methods of fabricating nonvolatile memory devices having improved reliability.

According to some embodiments, a method of fabricating a nonvolatile memory device includes forming trenches in a substrate defining device isolation regions therein and active regions therebetween. The trenches and the active regions therebetween extend into first and second device regions of the substrate. A sacrificial layer is formed in the trenches between the active regions in the first device region, and an insulating layer is formed to substantially fill the trenches between the active regions in the second device region. At least a portion of the sacrificial layer in the trenches in the first device region is selectively removed to define gap regions extending along the trenches between the active regions in the first device region, while substantially maintaining the insulating layer in the trenches between the active regions in the second device region.

In some embodiments, the sacrificial layer may be a material having an etching selectivity to that of the insulating layer, and may be selectively removed by selectively etching the sacrificial layer to expose sidewalls of the trenches to define the gap regions. The trenches in the second device region may be substantially free of the sacrificial layer prior to selectively etching the sacrificial layer, such that selectively etching the sacrificial layer may define the gap regions in the trenches in the first device region without defining gap regions in the trenches in the second device region. The gap regions may be voids or cavities in the device isolation regions that are bounded by sidewalls of the trenches and any layers thereabove.

In some embodiments, the active regions of the first device region may include memory cell transistors of the nonvolatile memory device, and the active regions of the second device region may include select transistors of the nonvolatile memory device.

In some embodiments, forming the sacrificial layer may include forming a sacrificial material in the trenches in the first device region, and, after forming the insulating layer substantially filling the trenches in the second device region, selectively recessing the sacrificial material in the trenches in the first device region to form the sacrificial layer therein.

In some embodiments, forming the insulating layer may include forming the insulating layer substantially filling the trenches in the first and second device regions, and selectively recessing the insulating layer in the trenches in the first device region prior to forming the sacrificial material therein while substantially maintaining the insulating layer in the trenches in the second device region.

In some embodiments, selectively recessing the insulating layer in the first device region may include forming a mask on the insulating layer in the second device region, where the mask exposes the insulating layer in the trenches in the first device region, and removing portions of the insulating layer in the trenches in the first device region exposed by the mask without substantially removing the insulating layer in the trenches in the second device region.

In some embodiments, the insulating layer may be a second insulating layer. Prior to forming the sacrificial material, a first insulating layer may be formed in the trenches in the first and second device regions, and the first insulating layer may be recessed in the trenches in the first and second device regions to expose sidewalls of the trenches prior to forming the second insulating layer substantially filling the trenches in the second device region.

In some embodiments, forming the sacrificial material may include forming the sacrificial material in the trenches in the first and second device regions after recessing the first insulating layer therein. The sacrificial material in the trenches in the second device region may be selectively removed while substantially maintaining the sacrificial material in the trenches in the first device region. The second insulating layer may be formed to substantially fill the trenches in the second device region after selectively removing the sacrificial material therefrom, and then the sacrificial material in the trenches in the first device region may be selectively recessed to define the sacrificial layer therein.

In some embodiments, selectively removing the sacrificial material in the trenches in the second device region may include forming a mask on the sacrificial material in the first device region, where the mask exposes the sacrificial material in the trenches in the second device region, and removing the sacrificial material in the trenches in the second device region exposed by the mask without substantially removing the sacrificial material in the trenches in the first device region.

In some embodiments, after recessing the sacrificial material in the trenches in the first device region, a spacer insulating layer may be formed on the sacrificial layer in the trenches in the first device region. The spacer insulating layer may include at least one opening therein exposing a portion of the sacrificial layer thereunder. The sacrificial layer may be selectively etched through the at least one opening in the spacer insulating layer to define the gap regions under the spacer insulating layer.

In some embodiments, prior to forming the trenches in the substrate, a dielectric material may be formed on the substrate; and a charge storage material may be formed on the dielectric material. The charge storage material, the dielectric material, and the substrate may be patterned to define the trenches between the active regions in the first and second device regions, and to define a charge storage pattern and a dielectric layer on the active regions between the trenches.

In some embodiments, sidewalls of the charge storage pattern may be exposed by the sacrificial layer in the trenches in the first device region.

In some embodiments, forming the spacer insulating layer may include forming the spacer insulating layer on the sacrificial layer in the trenches and on sidewalls of the charge storage patterns in the first device region, and patterning the spacer insulating layer to define spacers on sidewalls of the charge storage patterns in the first device region prior to selectively removing the sacrificial layer thereunder.

In some embodiments, a second insulating layer may be formed on the spacer insulating layer after selectively removing the sacrificial layer thereunder. The second insulating layer may be confined above the gap regions in the trenches under the spacer insulating layer. In some embodiments, the second insulating layer may be deposited such that a step coverage thereof is insufficient to extend into the gap regions in the trenches under the spacer insulating layer. The gap regions may be cavities in the device isolation regions that are bounded by sidewalls of the trenches and the second insulating layer.

According to further embodiments of the present inventive concept, there is provided a method of fabricating a nonvolatile memory device including providing a substrate having active regions defined by a plurality of trenches extending in a first direction and including a first region and a second region, filling the plurality of trenches with a first insulating material, forming first recesses in the first region by removing the first insulating material in the first region, filling the first recesses with a sacrificial material, exposing top portions of the first recesses by partially removing the sacrificial material, forming a second insulating material on the top portions of the first recesses, and forming air gaps in bottom portions of the first recesses by removing the sacrificial material remaining in the bottom portions of the first recesses.

According to still further embodiments of the present inventive concept, there is provided a method of fabricating a nonvolatile memory device including providing a substrate having active regions defined by a plurality of trenches extending in a first direction and including a first region and a second region, filling at least portions of the plurality of trenches with a sacrificial material, forming second recesses in the second region by removing the sacrificial material in the second region, filling the second recesses with a first insulating material, exposing top portions of first recesses in the first region by partially removing the sacrificial material in the first region, forming a second insulating material on the top portions of the first recesses, and forming air gaps in the bottom portions of the first recesses by removing the sacrificial material remaining in the bottom portions of the first recesses.

BRIEF DESCRIPTION OF THE DRAWINGS

The above and other features and advantages of the present inventive concept will become more apparent by describing in detail preferred embodiments thereof with reference to the attached drawings in which.

DETAILED DESCRIPTION OF EMBODIMENTS

Figure 1:
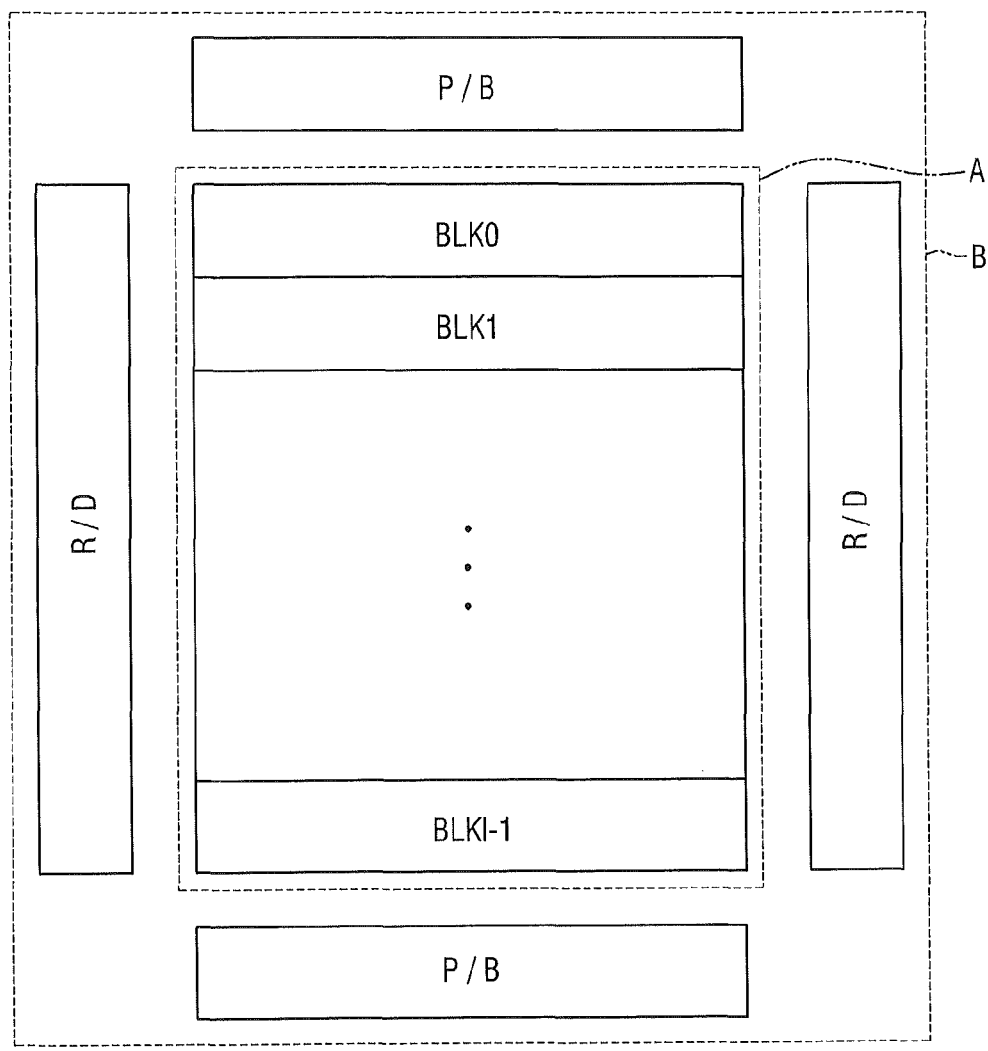
FIG. 1 is a block diagram of a NAND-type nonvolatile semiconductor integrated circuit device including transistors in accordance with some embodiments of the inventive concept.

Advantages and features of the present inventive concept and methods of accomplishing the same may be understood more readily by reference to the following detailed description of embodiments and the accompanying drawings. The present inventive concept may, however, be embodied in many different forms and should not be construed as being limited to the embodiments set forth herein. Rather, these embodiments are provided so that this disclosure will be thorough and complete and will fully convey the concept of the inventive concept to those skilled in the art, and the present invention will only be defined by the appended claims. In the drawings, the thickness of layers and regions are exaggerated for clarity.

Like numbers refer to like elements throughout. As used herein, the term "and/or" includes any and all combinations of one or more of the associated listed items.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "made of," when used in this specification, specify the presence of stated features, integers, steps, operations, elements, and/or components, but do not preclude the presence or addition of one or more other features, integers, steps, operations, elements, components, and/or groups thereof.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is inverted, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein, but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Hereinafter, a method of fabricating a nonvolatile memory device according to embodiments of the present inventive concept and nonvolatile memory devices fabricated by the fabricating method will be described with reference to FIGS. 1 to 12.

First, a nonvolatile memory device in accordance with embodiments of the inventive concept will be described with reference to FIGS. 1 to 5. FIG. 1 is a block diagram of a NAND-type nonvolatile semiconductor integrated circuit device including transistors in accordance with some embodiments of the inventive concept, FIG. 2 is a circuit diagram illustrating a cell array region of FIG. 1, and FIG. 3 is a layout view illustrating a cell array region of FIG. 1.

Figure 2:
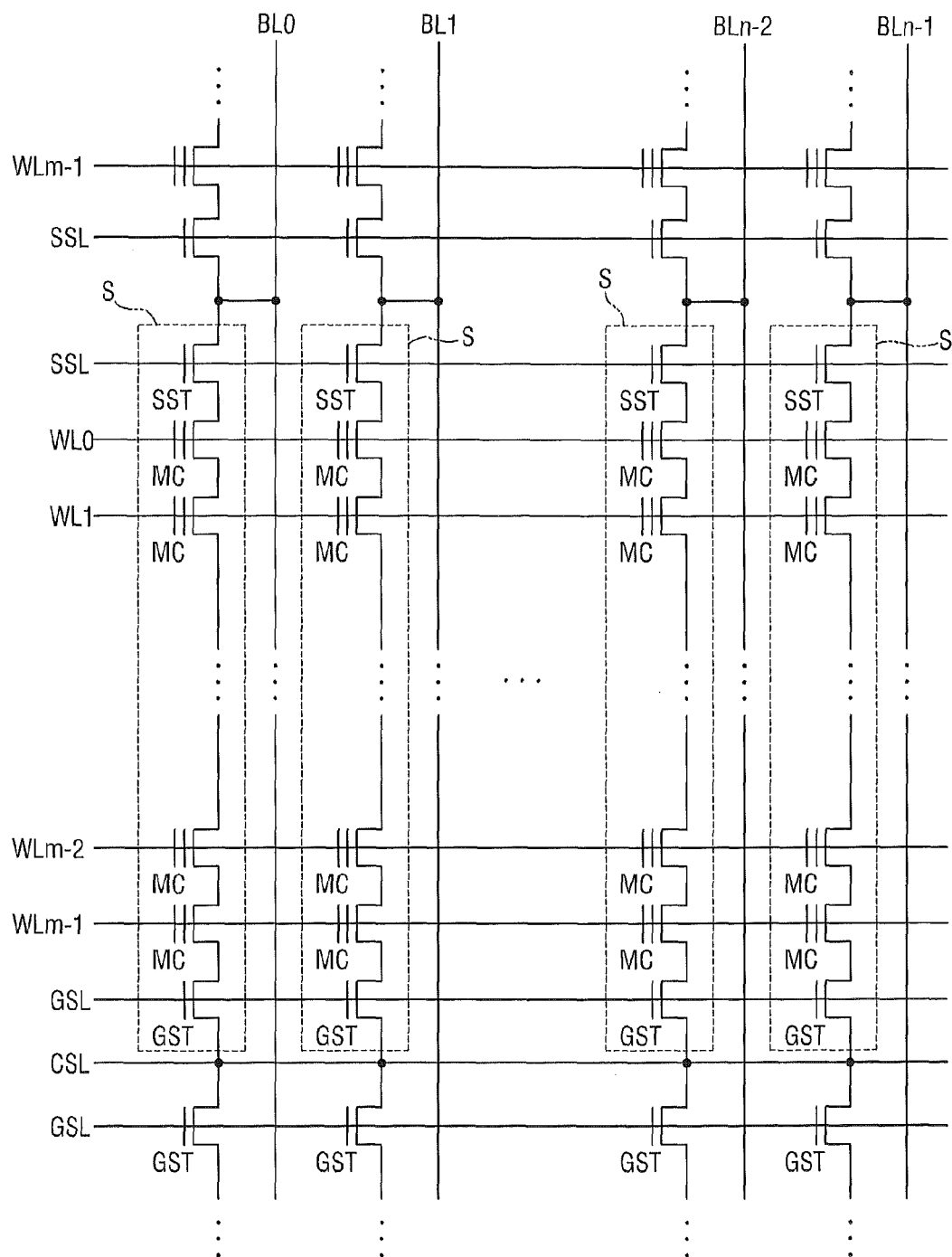
FIG. 2 is a circuit diagram illustrating a cell array region of FIG. 1.
Figure 3:
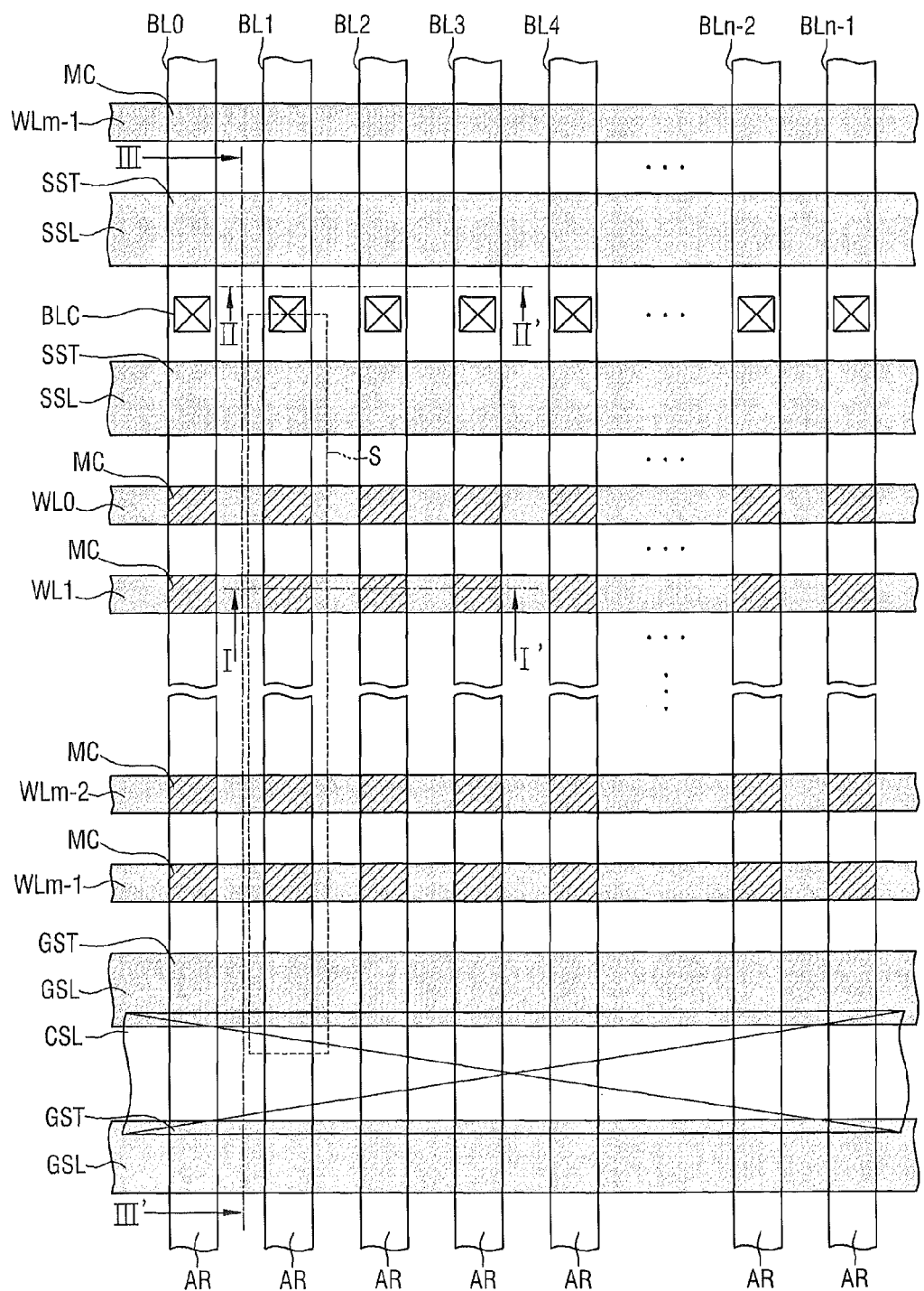
FIG. 3 is a layout view illustrating a cell array region of FIG. 1.

Referring to FIGS. 1 to 3, in the NAND-type nonvolatile semiconductor integrated circuit device, a plurality of cell blocks BLK0~BLK1−1 are repeatedly arranged in a memory cell array region A. A plurality of active regions ARs are arranged in each of the cell blocks BLK0~BLK1−1, and string select lines SSLs, ground select lines GSLs and a common source line CSL are arranged to extend in a direction perpendicular to the active regions ARs. A plurality of conductive lines WL0~WLm−1 are arranged between the string select lines SSLs and the ground select lines GSLs. In addition, a plurality of bit lines BL0~BLn−1 are arranged to cross the plurality of conductive lines WL0~WLm−1.

Memory cell transistors MCs are defined at intersections of the plurality of bit lines BL0~BLn−1 and the plurality of conductive lines WL0~WLm−1. String select transistors SSTs and ground select transistors GSTs are defined at intersections of the plurality of bit lines BL0~BLn−1 and the string select lines SSLs and at intersections of the bit lines BL0~BLn−1 and the ground select lines GSLs, respectively. The string select transistors SSTs, the plurality of memory cell transistors MCs and the ground select transistors GSTs are serially connected to form a string S. Strings S formed in the respective cell blocks BLK0~BLK1−1 are connected to each other in parallel for the plurality of bit lines BL. That is to say, drains of the string select transistors SSTs in each string S are connected to respective ones of the plurality of bit lines BL. Sources of the ground select transistors GSTs are connected to the common source line CSL.

Page buffers P/B are provided top and bottom portions of a peripheral circuit region B and row decoders RID are provided in the left and right sides of the peripheral circuit region B.

Figure 4:
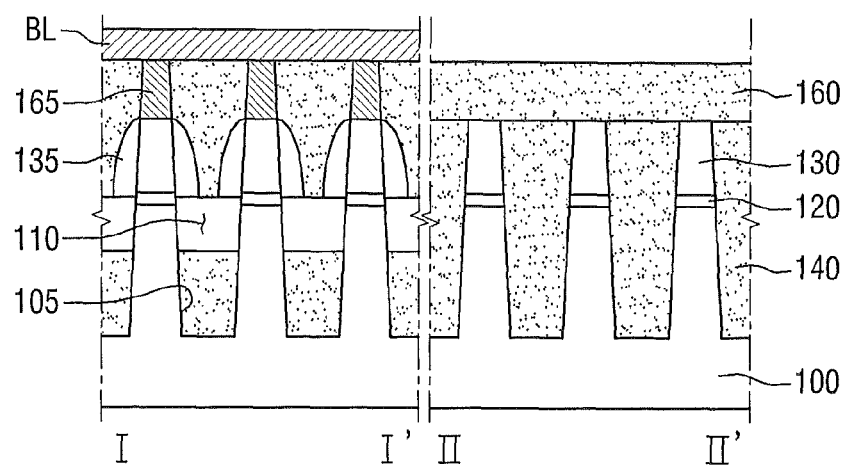
FIG. 4 is a cross-sectional view illustrating a nonvolatile memory device in accordance with some embodiments of the inventive concept, taken along the lines I-I' and II-II' of FIG. 3.
Figure 5:
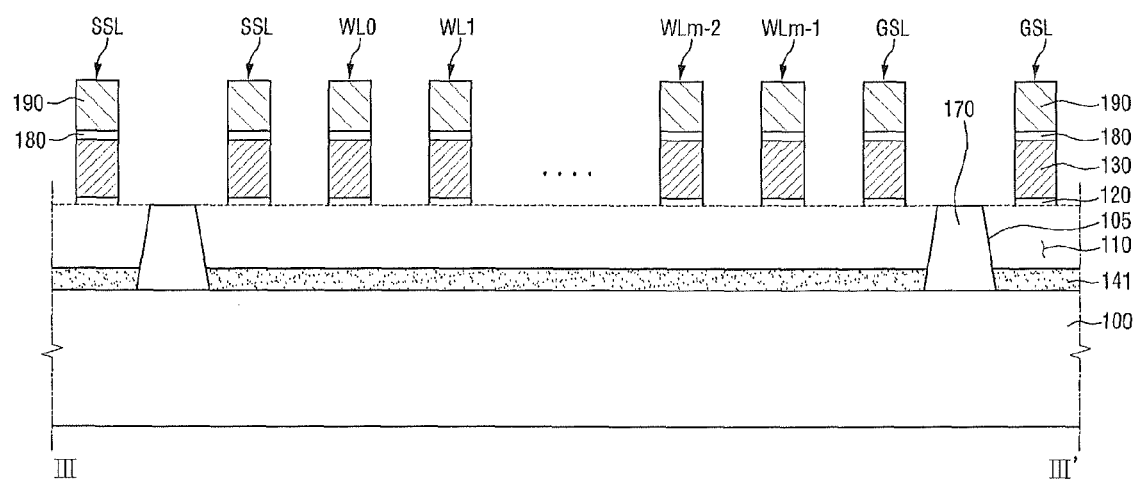
FIG. 5 is a cross-sectional view illustrating a nonvolatile memory device in accordance with some embodiments of the inventive concept, taken along the line III-III' of FIG. 3.

FIGS. 4 and 5 are cross-sectional views illustrating a nonvolatile memory device in accordance with some embodiments of the inventive concept, in which FIG. 4 is a cross-sectional view taken along the lines I-I' and II-II' of FIG. 3 and FIG. 5 is a cross-sectional view taken along the line of FIG. 3.

Referring FIGS. 3 to 5, a substrate 100 has active regions defined by a plurality of trenches 105. Further, the substrate 100 has a cell array region and a peripheral circuit region defined therein. In the cell array region, a plurality of active regions ARs are repeatedly arranged. Here, the substrate 100 may be made of at least one semiconductor substance selected from the group consisting of Si, Ge, SiGe, GaP, GaAs, SiC, SiGeC, InAs, and InP, but not limited thereto. Alternatively, or additionally the substrate 100 may be an SOI substrate. In addition, the substrate 100 may include a plurality of wells (not shown) for improving or optimizing characteristics of transistors formed in the cell array region and the peripheral circuit region. For example, pocket-type p wells may be formed in the cell array region, and n- and p-type wells may be formed in the peripheral circuit region.

A plurality of gate structures may be formed on the cell array region. Here, the gate structures may correspond to gate of the memory cell transistors MCs. The memory cell transistors MCs and the string select transistors SSTs or the ground select transistors GSTs may be formed on the cell array region. Driving transistors (not shown) may be formed on the peripheral circuit region. Each of the gate structures may include a first dielectric layer 120, a charge storage floating pattern 130, a second dielectric layer 180, and a conductive line 190, which are sequentially stacked.

As shown in FIG. 4, the substrate 100 may include a first region I and a second region II. The memory cell transistors MCs may be arranged in the first region I, and string select transistors SSTs may be arranged in the second region II. The ground select transistors GSTs may also be arranged in the second region II in addition to the string select transistors SSTs.

The first dielectric layer 120 and the charge storage floating pattern 130 are sequentially stacked on the substrate 100. Here, the first dielectric layer 120 and the charge storage floating pattern 130 may be formed in substantially the same pattern as the active region AR. The first dielectric layer 120 may be formed using a material and a thickness to be suitable for electron tunneling. For example, the first dielectric layer 120 may be formed of a single layer or a composite layer made of at least one of $SiO_2$, $Hf_xO_y$, $Al_xO_y$, $Zr_xO_y$, $Ta_xO_y$, $Hf_xSi_{1-x}O_y$, and $Hf_xSi_{1-x}O_yN_z$, but not limited thereto.

The charge storage floating pattern 130 is a region where the electrons tunneled through the first dielectric layer 120 are stored. In a case where a nonvolatile semiconductor integrated circuit device to be formed is of a floating gate type, the charge storage floating pattern 130 may be made of doped polysilicon. Meanwhile, in a case where a nonvolatile semiconductor integrated circuit device to be formed is of a floating trap type, such as a metal oxide nitride oxide semiconductor (MONOS) or a semiconductor oxide nitride oxide semiconductor (SONOS), the charge storage floating pattern 130 may be made of a material capable of trapping electrons, such as SiN, BN, or SiBN. In the latter case, the charge storage floating pattern 130 is non-conductive and may be formed lower than the pattern shown herein. Spacers 135 may further be formed on opposing sidewalls of the charge storage floating pattern 130.

The second dielectric layer 180 is an inter-gate insulating layer, and may reduce or prevent charges stored in the charge storage floating pattern 130 from moving toward the conductive line 190. The second dielectric layer 180 may be formed of a single layer or a composite layer made of at least one of $SiO_2$, ONO, HfxOy, AlxOy, ZrxOy, TaxOy, $Hf_xSi_{1-x}Oy$, and $Hf_xSi_{1-x}OyNz$, but not limited thereto. Further, the second dielectric layer 180 may be formed on a second isolation layer 162 and the charge storage floating pattern 130. The conductive line 190 may be formed on the second dielectric layer 180.

The conductive line 190 may form a word line. The conductive line 190 may be a single layer or a composite layer including two or more material layers. For example, the conductive line 190 may have a stacked structure including lower and upper conductive lines sequentially stacked. The stacked structure including lower and upper conductive lines may include stacked structures of metal layer/metal barrier layer, metal layer/doped polysilicon layer, metal silicide layer/metal silicide layer, and/or metal silicide layer/doped polysilicon layer. Specifically, the stacked structure in which the lower conductive line is made of a material having lower resistance than the upper conductive line can be applied to embodiments of the present inventive concept more effectively.

Examples of metals that can be used in the conductive line 190 may include, but are not limited to, W, Ni, Co, Ru—Ta, Ni—Ti, Ti—Al—N, Zr, Hf, Ti, Ta, Mo, Ta—Pt, Ta—Ti, and/or W—Ti. Examples of metal barrier layers may include, but are not limited to, WN, TiN, TaN, TaCN, and MoN. Examples of the useful metal silicide may include, but not limited to, $WSi_x$, $CoSi_x$, and/or $NiSi_x$.

A gap region, illustrated by way of example as an air gap 110, is formed in each of the trenches 105, and a gate structure including the charge storage floating pattern 130 and the spacers 135 may be disposed on the air gap 110. More specifically, a bottom portion of each trench 105 may be filled with a first insulating material 140, and a space between two neighboring charge storage floating patterns 130 may be filled with a second insulating material 160. The gap region may indicate an absence of a sacrificial layer 152 (as removed in accordance with embodiments described below), and may be a void or cavity that is bounded by the insulating material 140, the insulating material 160, and the sidewalls of the trench 105. Here, the air gap 110 may be formed between the first insulating material 140 and the second insulating material 160. The air gap 110 is formed in a bottom portion of the charge storage floating pattern 130 and defined within each trench 105. In other words, the air gap 110 may be formed in the bottom portion of the charge storage floating pattern 130 to be disposed between two neighboring or adjacent active regions ARs.

FIG. 5 is a cross-sectional view taken along a direction in which the plurality of bit lines BL0~BLn−1 are extended. As shown in FIG. 5, the air gap 110 may be formed to extend along the device isolation region. In other words, since the air gap 110 is formed in the trench 105 that defines the device isolation region, the air gap 110 may be disposed in a portion of the device isolation region.

Next, a method of fabricating a nonvolatile memory device in accordance with some embodiments of the inventive concept will be described with reference to FIGS. 6 to 12. FIGS. 6 to 12 are cross-sectional views illustrating various intermediate structures for explaining a method of fabricating a nonvolatile memory device in accordance with embodiments of the inventive concept. A description of elements similar to those of the embodiments previously described above will be omitted or simplified.

Figure 6:
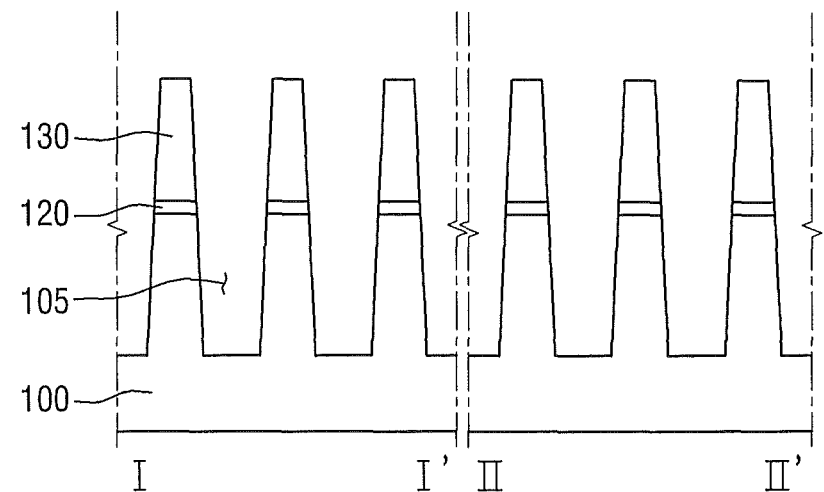
FIGS. 6 to 12 are cross-sectional views illustrating various process steps in a method of fabricating a nonvolatile memory device in accordance with some embodiments of the inventive concept.

Referring to FIG. 6, a substrate 100 having active regions defined by a plurality of trenches 105 are provided, the substrate 100 including a first region (I) and a second region (II) defined therein. Here, a first dielectric layer 120 and a charge storage floating pattern 130 may be sequentially stacked on the active regions of the substrate 100.

More specifically, a material for forming a first dielectric layer pattern may be stacked on the active region of the substrate 100 by, for example, chemical vapor deposition (CVD), thereby forming a first dielectric layer pattern forming layer. The material for forming the first dielectric layer pattern may be, for example, $Hf_xSi_{1-x}O_y$, but is not limited thereto.

A material for forming a charge, storage floating pattern may be stacked on the first dielectric layer pattern forming layer by, for example, chemical vapor deposition (CVD), thereby forming a charge storage floating pattern forming layer. The material for forming the charge storage floating pattern may be, for example, polysilicon, but is not limited thereto.

The first dielectric layer pattern forming layer and the charge storage floating pattern forming layer may be patterned by photolithography. At this stage, the plurality of trenches 105 defining the active regions may be formed. That is to say, the forming of the plurality of trenches 105 may include sequentially stacking a dielectric material layer and a charge storage floating material layer on the substrate 100 and sequentially patterning the charge storage floating material layer, the dielectric material layer and the substrate 100. As the result, the charge storage floating pattern 130 and the first dielectric layer 120 may be formed on the active regions ARs.

Figure 7:
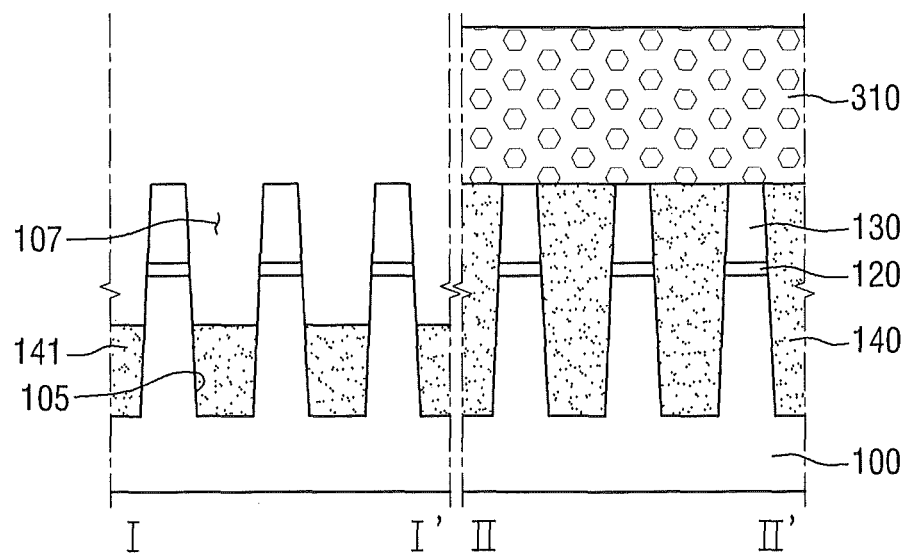

Referring to FIG. 7, the plurality of trenches 105 are filled with a first insulating material 140, and the first insulating material 140 in the first region I is selectively removed to form first recesses 107 in the first region I. More specifically, a CVD process is performed to fill the plurality of trenches 105 with the first insulating material 140. Here, the first insulating material 140 may be made of oxide or nitride.

The first insulating material 140 in the first region I may be selectively removed. In other words, at least a portion of the first insulating material 140 in each of the trenches 105 in the first region I is removed, while the first insulating material 140 in each of the trenches 105 in the second region II is allowed to remain. In particular, as shown in FIG. 7, an etch mask 310 opening or exposing the first region I and blocking or masking the second region II is formed on the first insulating material 140. Then, at least a portion of the first insulating material 140 in each of the trenches 105 in the first region I is selectively removed using the etch mask 310.

Figure 8:
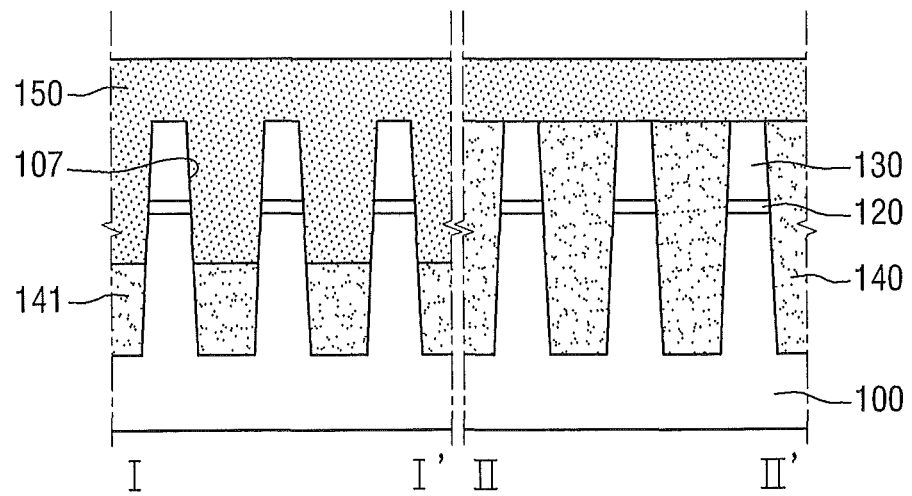

Accordingly, the first insulating material 140 is formed in a bottom portion 141 of each trench 105 in the first region I, and first recesses 107 are defined in top portions of the trenches 105. Here, the dielectric material layer 120 and the floating material layer 130 are exposed through the top portions of the first recesses 107, while at least portions of the active regions ARs are exposed through the bottom portions of the first recesses 107, Referring to FIG. 8, the first recesses 107 are filled with a sacrificial material 150. The sacrificial material 150 may be deposited by, for example, CVD. As shown in FIG. 8, when the first recesses 107 are filled with the sacrificial material 150, the sacrificial material 150 may also be formed on the charge storage floating pattern 130 and the first insulating material 140 In addition, the sacrificial material 150 may be formed, for example, using a spin on hardmask (SOH) or a silicon nitride (SiN) layer.

Figure 9:
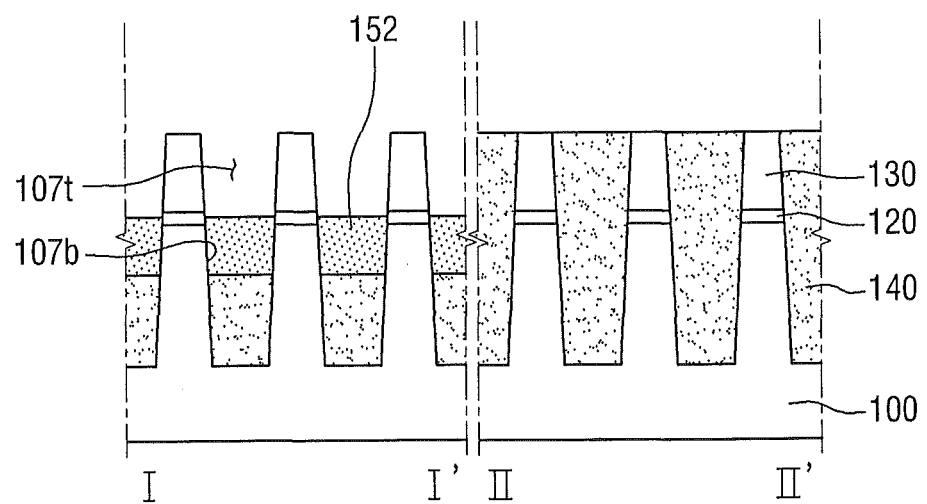

Referring to FIG. 9, a sacrificial material portion 152 of the sacrificial material 150 is removed to expose a top portion 107t of each first recess 107. For example, the sacrificial material 150 formed at portions other than the bottom portions of the first recesses 107 may be removed by, for example, an etch back process such that a sacrificial portion 152 remains. Accordingly, the top portion 107t of each first recess 107 may be defined between two neighboring charge storage floating patterns 130. As described above, the dielectric material layer 120 and the floating material layer 130 are exposed at the top portion 107t of each of the first recesses 107, while at least portions of the active regions ARs of the substrate 100 are exposed at the bottom portions of the first recesses 107.

Further, the sacrificial material portion or layer 152 remains in bottom portions 107b of the first recesses 107. The sacrificial material portion 152 remaining in the bottom portion 107b of the first recess 107 is a region where gap regions (shown as air gaps 110 of FIG. 4) are to be formed in a subsequent step. Thus, the sacrificial material 150 is partially removed such that the sacrificial material portion 152 may remain with a depth sufficient to form air gaps 110 in the trenches 105. In other words, a top surface of the remaining sacrificial material portion 152 may be the same plane as or may define an upper boundary for the top of the air gap 110 to be formed in a subsequent process.

Figure 10:
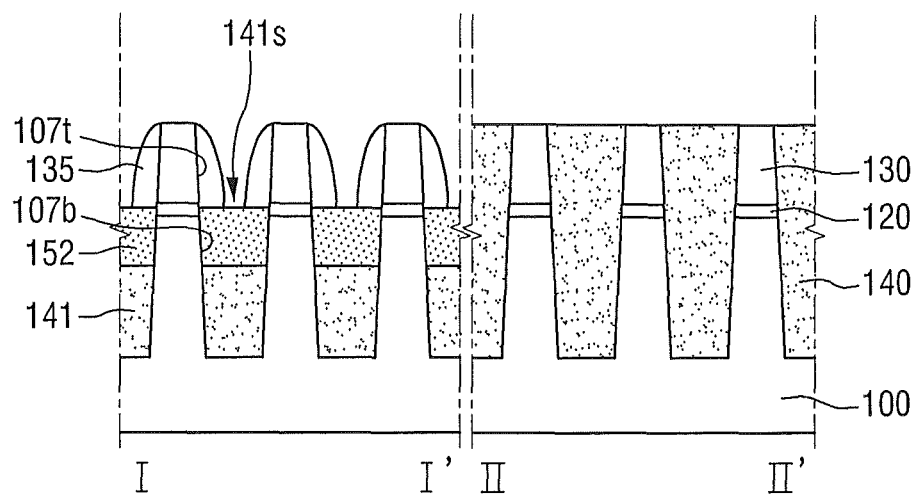

The spacers 135 may be formed on opposing sidewalls of the floating material layer 130 exposed at the top portions 107t of the first recesses 107. One side of the spacers 135 contacts the floating material layer 130, the other side thereof is exposed and spaced apart from a neighboring spacer 135 to partially expose the top surface 141s of the underlying sacrificial material portion 152, for example, referring to FIG. 10, a second insulating material 135 is formed on top portions of the first recesses 107. More specifically, the second insulating material 135 is formed on the top portions 107t of the first recesses 107, while partially exposing the top surface 141s of the sacrificial material portion 152 remaining in the bottom portions 107b of the first recesses 107. As shown in FIG. 10, the forming of the second insulating material 135 on the top portions 107t of the first recesses 107 may include forming spacers 135 on opposing sidewalls of the top portions 107t of the first recesses 107.

Figure 11:
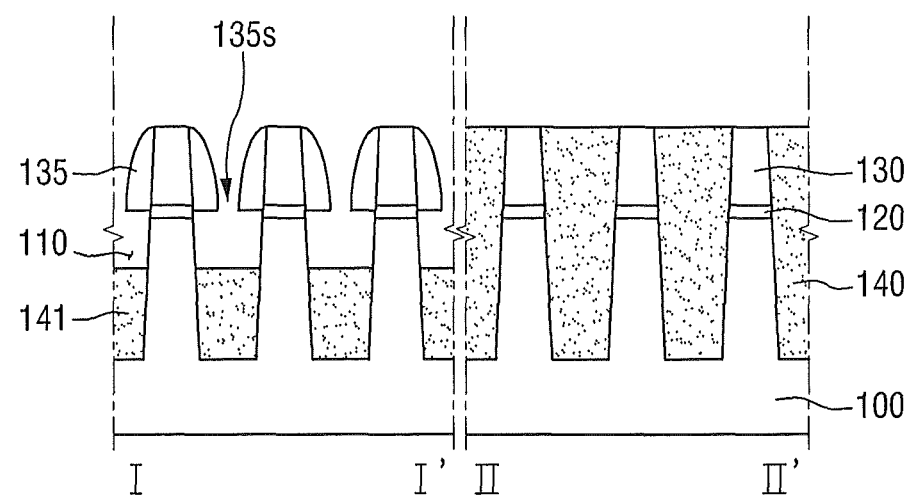

Referring to FIG. 11, air gaps 110 are formed in the bottom portions 107b of the first recesses 107 by selectively removing the sacrificial material portion 152 in the first region 1. As described above, the top surface (141s of FIG. 10) of the sacrificial material portion 152 may be exposed through the second insulating material, for example, by a space 135s between neighboring spacers 135. The sacrificial material portion 152 may be selectively removed by, for example, dry etching or wet etching Here, not only the sacrificial material portion 152 of the exposed top surface 141s but also the sacrificial material portion 152 of a non-exposed region beneath the exposed top surface 141 may be removed by adjusting process conditions, including a process time and an etching gas. In addition, the sacrificial material portion 152 may be selectively removed using etching selectivity between the sacrificial material portion 152 and the second insulating material 135 and between the sacrificial material portion 152 and the floating material layer 130.

For example, in a case where the sacrificial material portion 152 is formed using a spin on hardmask (SOH), the sacrificial material portion 152 in the non-exposed region and the exposed region may be removed by, for example, ashing. Alternatively, in a case where the sacrificial material portion 152 is formed using a silicon nitride layer, etching selectivity of the sacrificial material portion 152 may be increased using phosphoric acid. However, the removing methods illustrated herein are provided only by way of examples but the sacrificial material portion 152 may be selectively removed by various methods.

Accordingly, the sacrificial material portion 152 in the bottom portions 107b of the first recesses 107 may be removed, and the air gaps 110 may be formed in the portions 107b of the first recesses 107.

Figure 12:
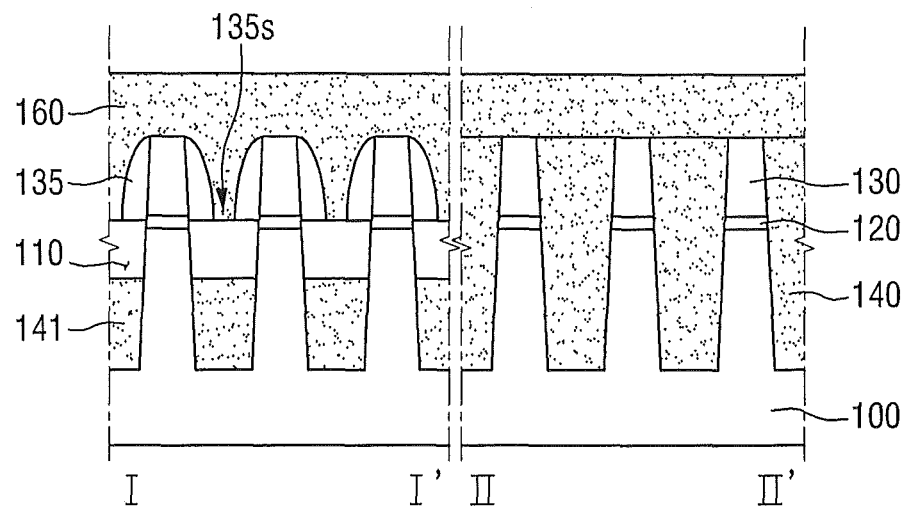

Referring to FIG. 12, a third insulating material 160 is formed on the second insulating material 135, while maintaining the air gaps 110. As shown in FIG. 12, the third insulating material 160 may be formed on the substrate 100 having the second insulating material 135. A space 135s between neighboring spacers 135 may be filled with the third insulating material 160 by, for example, CVD. In other words, the third insulating material 160 may be on the space 135s between the spacers 135 in the first region I and on the first insulating material 140 in the second region II. For example, the third insulating material 160 may be made using a material or a deposition method that provides relatively low step coverage. More specifically, the third insulating material 160 fills the space 135s between the spacers 135 in the first region I while maintaining the air gaps 110. In other words, process conditions may be adjusted such that the third insulating material 160 penetrates into and fills the space 135s between the spacers 135 in the first region I while not filling interior portions of the air gaps 110.

Referring back to FIG. 4, conductive contacts 165 electrically connecting the bit line BL and the gate structure through the third insulating material 160 may be formed on the third insulating material 160. This subsequent process may be modified in various manners and may be applied to the present invention. Since well known methods may be used in such a process, a detailed description thereof will be omitted.

As described above, in methods of fabricating a nonvolatile memory device according to some embodiments of the present inventive concept, since the first insulating material formed in the first region is selectively removed in the removing of the first insulating material to form the air gaps, and the first insulating material in the second region is allowed to remain, it is not necessary to perform a process of removing the air gaps. Therefore, it is possible to prevent spaces for the air gaps in an unfilled region from being reduced by a deposition process for partially filling the air gaps. That is to say, sufficient spaces for the air gap can be secured and the air gaps can be formed in a stable manner. Accordingly, the nonvolatile memory device having improved reliability can be fabricated.

Hereinafter, a fabricating method of a nonvolatile memory device in accordance with another embodiment of the inventive concept will be described with reference to FIGS. 13 to 20. FIGS. 13 to 20 are cross-sectional views illustrating various process steps in a method of fabricating a nonvolatile memory device in accordance with further embodiments of the inventive concept. For convenience of explanation, description of elements similar to those of the embodiments previously described above will be omitted or simplified.

Figure 13:
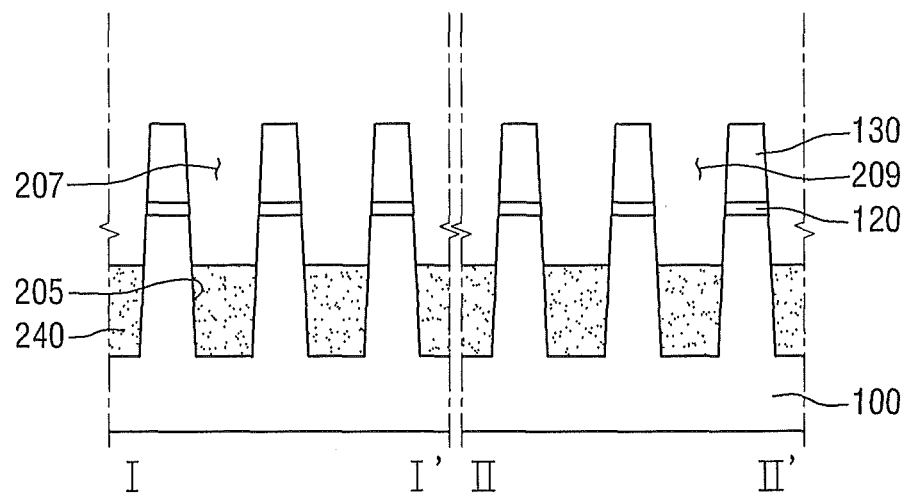
FIGS. 13 to 20 are cross-sectional views illustrating various process steps in a method of fabricating nonvolatile memory device in accordance with further embodiments of the inventive concept.

First, referring to FIG. 13, a substrate 100 having active regions ARs defined by a plurality of trenches 205 extending in a first direction is provided, the substrate 100 including a first region I and a second region II. More specifically, a first dielectric layer 120 and a charge storage floating pattern 130 may be sequentially stacked on the active regions ARs of the substrate 100. In addition, as shown in FIG. 13, a first insulating material 240 may be formed in bottom portions of the trenches 205. Accordingly, first recesses 207 may be defined extending along the trenches 205 of the first region I and second recesses 209 may be defined in the trenches 205 of the second region II. A depth of each of the first recesses 207 may correspond to a depth of each of the air gaps 110. Further, memory cell transistors MCs may be arranged in the first region I of the substrate 100, and string select transistors SSTs may be arranged in the second region II of the substrate 100. Here, ground select transistors GSTs may further be arranged in the second region II in addition to the string select transistors SSTs.

The first insulating material 240 may be used to form a first insulating material layer filling the plurality of trenches 205, and the first insulating material layer may be removed to a desired depth by performing an etching process, for example, an etch back process. When the first insulating material layer filling the trenches 205 in both the first region I and the second region II is removed by etching at once, the depth of the second recess 209 may be substantially the same as the depth of the first recess 207.

Figure 14:
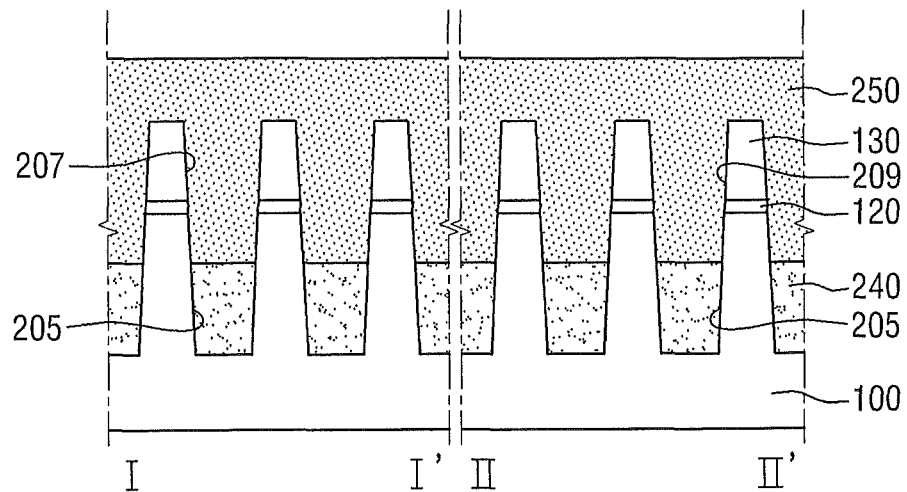

Referring to FIG. 14, at least portions of the plurality of trenches 205 are filled with a sacrificial material 250. As shown in FIG. 14, at least portions of the trenches 205, that is, the first recesses 207 and the second recesses 209, may be filled with the sacrificial material 250.

The sacrificial material 250 may be deposited on the substrate 100 by, for example, CVD. In addition, the sacrificial material 250 may be formed of, for example, using a spin on hardmask (SOH) or a silicon nitride (SiN) layer, but not limited thereto.

Figure 15:
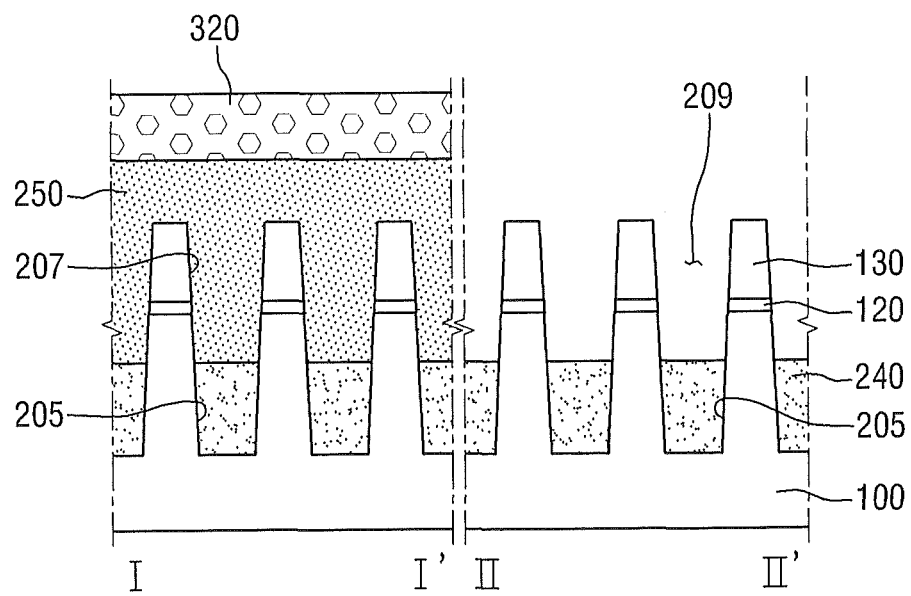

Referring to FIG. 15, the second recesses 209 are formed in the second region II by removing the sacrificial material 250 of the second region II. More specifically, the removing of the sacrificial material 250 in the second region II may include forming the second recesses 209 by removing the sacrificial material 250 in the trenches 205 in the second region II while allowing the sacrificial material 250 in the trenches 205 in the first region I to remain. As shown, an etch mask 320 is formed on the sacrificial material 250, the etch mask 320 blocking the first region I and opening the second region II, and the sacrificial material 250 in the trenches 205 in the second region II is removed using the etch mask. Here, the etching may be performed by, for example, an etch-back process.

Figure 16:
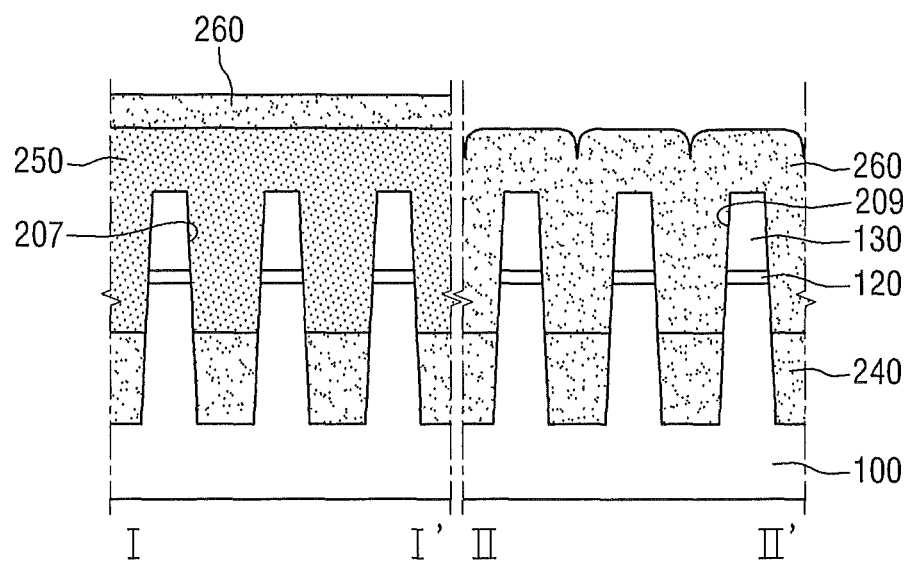

Referring to FIG. 16, the second recesses 209 are filled with a second insulating material 260. More specifically, the etch mask (320 of FIG. 15) may be removed by, for example, ashing. Next, the second insulating material 260 may be deposited by, for example, CVD or ALD, to fill the second recesses 209 in the second region II. The depositing of the second insulating material 260 may be performed on the entire surface of the substrate 100. Accordingly, as shown, the second insulating material 260 may also be deposited on the sacrificial material 250 in the first region I.

Figure 17:
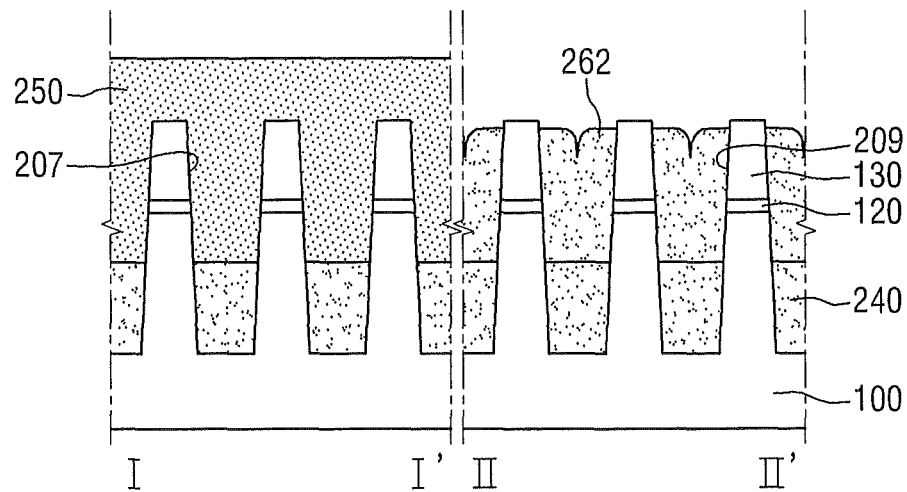

As shown in FIG. 17, the second insulating material (260 of FIG. 16) formed on the sacrificial material 250 in the first region I may be removed by an etch-back process. The second insulating material 260 may be removed by the etch-back process to expose a top surface of the sacrificial material 250 in the first region. A portion of the second insulating material 260 in the second region II may also be removed I such that a recessed portion remains in the second region II.

Figure 18:
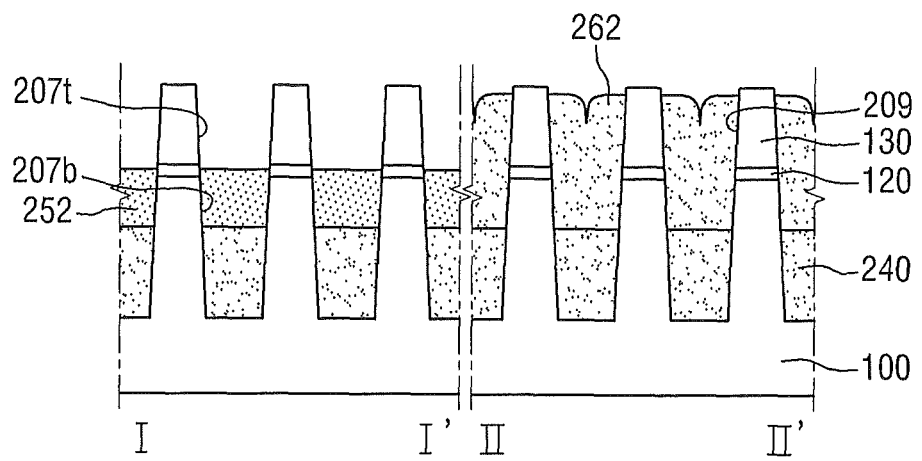

Referring to FIG. 18, the second insulating material portion 262 in the first region I is removed to expose top portions 207t of the first recesses 207 in the first region I. The sacrificial material 250 in the first region I may be removed by, for example, dry etching or wet etching. More specifically, the sacrificial material 250 in the first region I may be removed while allowing the sacrificial material portion 252 in the bottom portions 207b of the first recesses 207 to remain. The sacrificial material portion 252 remaining in the bottom portion 207b of the first recess 207 is a region where gap regions (such as the air gaps 110 of FIG. 21) are to be formed in a subsequent process. Thus, the sacrificial material 250 is partially removed such that the sacrificial material portion 252 may remain by a depth enough to form air gaps 110 in the trenches 205. In other words, a top surface of the remaining sacrificial material portion 252 may be the same plane as the top boundary of the air gap 110 to be formed in a subsequent process.

Figure 19:
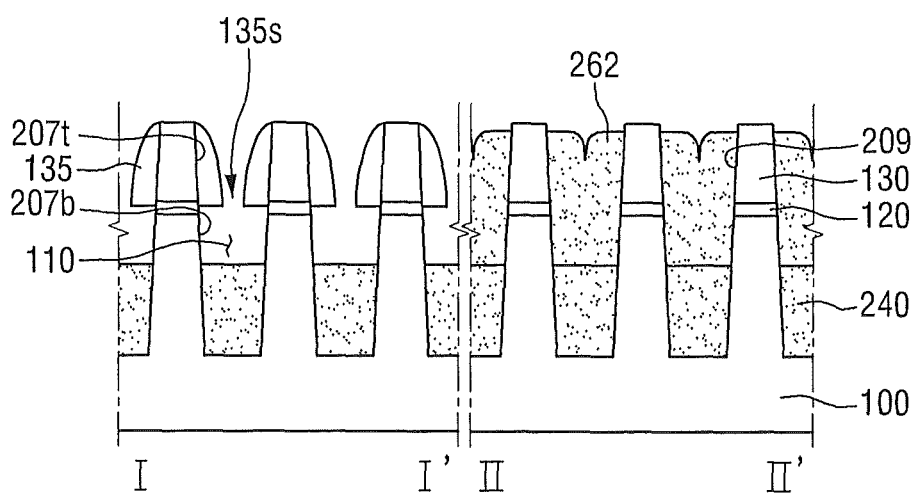

Referring to FIG. 19, a third insulating material 135 is formed on top portions 207t of the first recesses 207, and the sacrificial material portion 252 remaining in the bottom portion 207b of the first recess 207 is selectively removed to form the air gaps 110 in the bottom portion 207b of the first recess 207. More specifically, in a state in which the sacrificial material portion 252 remains in the bottom portion 207b of the first recess 207, the third insulating material 135 may be formed on the top portions 207t of the first recesses 207. That is to say, the third insulating material 135 may be formed on the remaining sacrificial material portion 252. Here, the third insulating material 135 may be formed to expose the top surface of the sacrificial material portion 252 remaining in the bottom portion 207b of the first recess 207.

As shown in FIG. 19, the third insulating material 135 may be formed as spacers 135 on opposing sidewalls of the top portions 207t of the first recesses 207. More specifically, one side of the spacers 135 contacts the floating material layer 130, the other side thereof is exposed and spaced apart from a neighboring spacer 135 by a space 135s to partially expose the top surface of the underlying sacrificial material portion 252. The exposing of the top surfaces of the third insulating material 135 and the sacrificial material portion 252 has been described above with respect to previous embodiments, and repeated descriptions thereof will be omitted.

Figure 20:
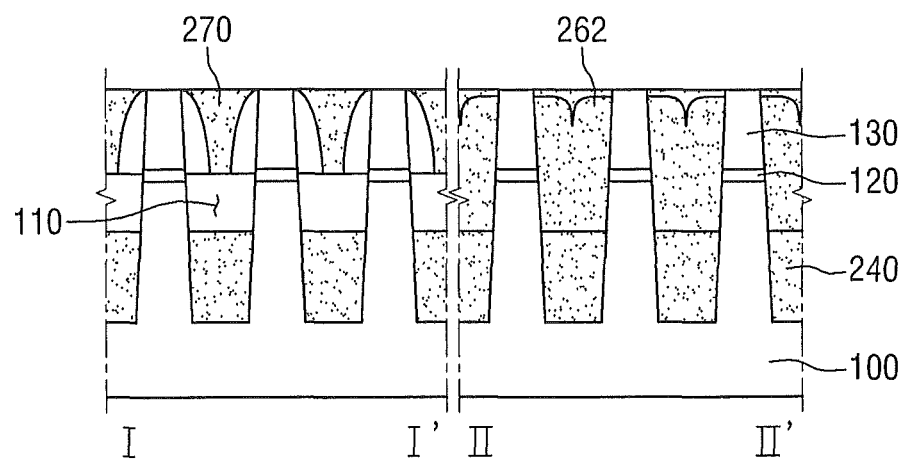

Referring to FIG. 20, a fourth insulating material 270 is formed on the third insulating material 135, while maintaining the air gaps 110. As shown in FIG. 20, the fourth insulating material 270 may be formed on the substrate 100 having the third insulating material 135. As described above, the fourth insulating material 270 may be on a space 135s between the adjacent spacers 135 in the first region I and on the third insulating material 135 in the second region II.

As in the previously described embodiments, the fourth insulating material 270 may be made using a material or a deposition method providing relatively low step coverage. Accordingly, process conditions may be adjusted such that the fourth insulating material 270 penetrates into and fills the space 135s between adjacent spacers 135 in the first region I while not filling interior portions of the air gaps 110. The nonvolatile memory device may be completed in subsequent processes. The subsequent processes may be known in the related art, and a detailed description thereof will be omitted.

As described above, in methods of fabricating nonvolatile memory devices according to some embodiments of the present inventive concept, the sacrificial material formed in the second region is first selectively removed, and the space from which the sacrificial material is removed is filled with an insulating material, followed by selectively forming air gaps in the first region. Accordingly, it may not be necessary to perform a process of filling the air gaps in the second region after forming the air gaps in the first region. Therefore, it may be possible to reduce or prevent spaces for the air gaps in the first unfilled region from being reduced by a deposition process for partially filling the air gaps in the second region. That is to say, sufficient spaces for the air gap can be secured and the air gaps can be formed in a stable manner. Accordingly, nonvolatile memory devices having improved reliability can be fabricated.

While the present invention has been particularly shown and described with reference to exemplary embodiments thereof, it will be understood by those of ordinary skill in the art that various changes in form and details may be made therein without departing from the spirit and scope of the present inventive concept as defined by the following claims. It is therefore desired that the present embodiments be considered in all respects as illustrative and not restrictive, reference being made to the appended claims rather than the foregoing description to indicate the scope of the inventive concept.

What is claimed is:

1. A method of fabricating a nonvolatile memory device comprising:
   providing a substrate having active regions defined by a plurality of trenches extending in a first direction, the substrate including a first region and a second region;
   filling at least portions of the plurality of trenches with a sacrificial material;
   forming second recesses in the second region by removing the sacrificial material in the second region;
   filling the second recesses with a first insulating material;
   exposing top portions of first recesses in the first region by partially removing the sacrificial material in the first region;
   forming a second insulating material on the top portions of the first recesses; and
   forming air gaps in bottom portions of the first recesses by removing the sacrificial material remaining in the bottom portions of the first recesses.

2. The method of claim 1, wherein memory cell transistors are formed in the first region and string select transistors are formed in the second region.

3. The method of claim 1, wherein the removing of the sacrificial material in the second region comprises forming the second recesses by removing the sacrificial material in each of the trenches in the second region while maintaining the sacrificial material in each of the trenches in the first region.

4. The fabricating method of claim 1, wherein the removing of the sacrificial material in the second region comprises:
   forming an etch mask on the sacrificial material, the etch mask blocking the first region and exposing the second region; and
   removing the sacrificial material in each of the trenches in the second region using the etch mask.

5. The fabricating method of claim 1, wherein the forming of the second insulating material on top portions of the first recesses comprises forming spacers at opposing sidewalls of the top portions of the first recesses to expose a top surface of the sacrificial material.

6. The fabricating method of claim 5, wherein the removing of the sacrificial material remaining in the bottom portions of the first recesses comprises removing the sacrificial material through the top surface of the sacrificial material exposed by the spacers.

7. The fabricating method of claim 1, wherein the forming of the plurality of trenches comprises:
   sequentially stacking a dielectric material layer and a floating material layer on the substrate;
   sequentially patterning the floating material layer, the dielectric material layer and the substrate; and
   forming a charge storage floating pattern and a first dielectric layer on the active regions.

8. The fabricating method of claim 7, wherein the dielectric material layer and the floating material layer are exposed through the top portions of the first recesses, while at least portions of the active regions are exposed through the bottom portions of the first recesses.

9. The fabricating method of claim 1, wherein a third insulating material is formed on the second insulating material while maintaining the air gaps.

* * * * *